(12) United States Patent
Kammuri et al.

(10) Patent No.: US 11,259,449 B2
(45) Date of Patent: Feb. 22, 2022

(54) ELECTROMAGNETIC WAVE SHIELDING MATERIAL

(71) Applicant: JX Nippon Mining & Metals Corporation, Tokyo (JP)

(72) Inventors: Kazuki Kammuri, Ibaraki (JP); Koichiro Tanaka, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 15/735,986

(22) PCT Filed: Apr. 7, 2016

(86) PCT No.: PCT/JP2016/061433
§ 371 (c)(1),
(2) Date: Dec. 13, 2017

(87) PCT Pub. No.: WO2016/203825
PCT Pub. Date: Dec. 22, 2016

(65) Prior Publication Data
US 2018/0177083 A1 Jun. 21, 2018

(30) Foreign Application Priority Data
Jun. 15, 2015 (JP) .............................. JP2015-120679

(51) Int. Cl.
*H05K 9/00* (2006.01)
*B32B 15/08* (2006.01)

(52) U.S. Cl.
CPC ........... *H05K 9/0075* (2013.01); *B32B 15/08* (2013.01); *H05K 9/0071* (2013.01); *H05K 9/0088* (2013.01)

(58) Field of Classification Search
CPC ............... H05K 9/0088; H05K 9/0075; H05K 9/0081
See application file for complete search history.

(56) References Cited

U.S. PATENT DOCUMENTS 3,512,946 A * 5/1970 Hutkin ................. H05K 9/0088
428/612
4,965,408 A * 10/1990 Chapman ................ B32B 15/08
174/363
(Continued)

FOREIGN PATENT DOCUMENTS

CN 107409482 A 11/2017
JP H069911 B2 * 2/1994
(Continued)

OTHER PUBLICATIONS

De Vries et al.—Uni-and bi-axial orientation of polymer films and sheets—J.Poly.Sci.PolySymp.—1977 (Year: 1977).*
(Continued)

*Primary Examiner* — Callie E Shosho
*Assistant Examiner* — John Vincent Lawler
(74) *Attorney, Agent, or Firm* — Nields, Lemack & Frame, LLC

(57) ABSTRACT

Provided is an electromagnetic wave shielding material that can exhibit improved electromagnetic wave shielding property, light-weight property and formability. The present invention relates to an electromagnetic wave shielding material comprising a laminate in which N number of metal foils each having a thickness of 5 to 100 μm and N+1 number of resin layers each having a thickness of 5 μm or more are alternately laminated or a laminate in which N+1 number of metal foils each having a thickness of 5 to 100 μm and N number of resin layers each having a thickness of 5 μm or more are alternately laminated, N being an integer of 2 or more, wherein thickness of the laminate is from 100 to 500 μm, and wherein, when a thickness center of the laminate is used as a reference, for all pairs of interfaces at which sequences of the resin layers and the metal foils on both upper and lower sides of the reference correspond to each (Continued)

other, distances from the reference to the interfaces have an error of within ±10%.

9 Claims, 1 Drawing Sheet

(56) References Cited

U.S. PATENT DOCUMENTS

| | | | | |
|---|---|---|---|---|
| 5,158,831 | A * | 10/1992 | Schirmer | B32B 15/08 428/457 |
| 2004/0170857 | A1 | 9/2004 | Yoshihara et al. | |
| 2004/0234750 | A1 * | 11/2004 | Yen | B32B 27/08 428/331 |
| 2005/0208798 | A1 | 9/2005 | Shimoda | |
| 2006/0176675 | A1 * | 8/2006 | Bourns | H01C 1/1406 361/780 |
| 2008/0012493 | A1 | 1/2008 | Lee et al. | |
| 2010/0300744 | A1 * | 12/2010 | Romanko | H05K 9/0088 174/388 |
| 2012/0236528 | A1 * | 9/2012 | Le | H05K 9/0088 361/818 |
| 2013/0206471 | A1 * | 8/2013 | Kammuri | H05K 9/0088 174/394 |
| 2013/0284511 | A1 * | 10/2013 | Kagawa | H05K 9/0088 174/388 |
| 2014/0093723 | A1 * | 4/2014 | Takeuchi | H01L 23/142 428/336 |
| 2018/0079177 | A1 | 3/2018 | Tanaka et al. | |

FOREIGN PATENT DOCUMENTS

| | | | | |
|---|---|---|---|---|
| JP | 6-85488 | A | | 3/1994 |
| JP | 7-290449 | A | | 11/1995 |
| JP | 2003/060387 | | * | 2/2003 ............ B32B 15/08 |
| JP | 2003-60387 | A | | 2/2003 |
| JP | 2003-285002 | A | | 10/2003 |
| JP | 2006007589 | | * | 1/2006 |
| JP | 2008-21979 | A | | 1/2008 |
| JP | 4602680 | B2 | | 12/2010 |
| JP | 2012/109452 | | * | 6/2012 ............ B32B 15/08 |
| JP | 2012-109452 | A | | 6/2012 |
| JP | 2015/091644 | | * | 5/2015 ........... B32B 15/088 |
| KR | 10-2004-0077511 | A | | 9/2004 |
| TW | 201213109 | A | | 4/2012 |

OTHER PUBLICATIONS

MT of Obayashi—JP H06-9911B2 (Year: 1994).*
MT of Nakagama—JP 2006 007589 A (Year: 2006).*
CNC Cookbook—Complete Surface Finish Chart, Symbols & Roughness Conversion Tables (Year: 2018).*
Tek Tip—Understanding Polyester Film Tolerances _ Tekra, A Division of EIS, Inc_ (Year: 2019).*
Ashizawa—JP 2003-060387 A—plastic_metal foil in form of metal particles—Google—2003 (Year: 2003).*
Denardin—Stress-strain behavior of PET—Rheol Acta—2005 (Year: 2005).*
Ikeda—JP 2012-109452 A—MT—multi-layer of fiber-reinforced resin+metal layer—2012 (Year: 2012).*
Mori—JP 2015-091644 A—MT—copper clad laminate w-roughness 10-pt & RMS—2015 (Year: 2015).*
Dong—Surface Characterization and Degradation Behavior of Polyimide Films Induced by Coupling Irradiation Treatment—RSC Adv.—2018 (Year: 2018).*
Hobeika—critical strains in PE & ethylene-vinyl acetate copolymer—Macro—2000 (Year: 2000).*
International Search Report dated Jun. 21, 2016 in corresponding PCT application No. PCT/JP2016/061433.
International Preliminary Report on Patentability dated Dec. 21, 2017 in corresponding PCT application No. PCT/JP2016/061433.

* cited by examiner

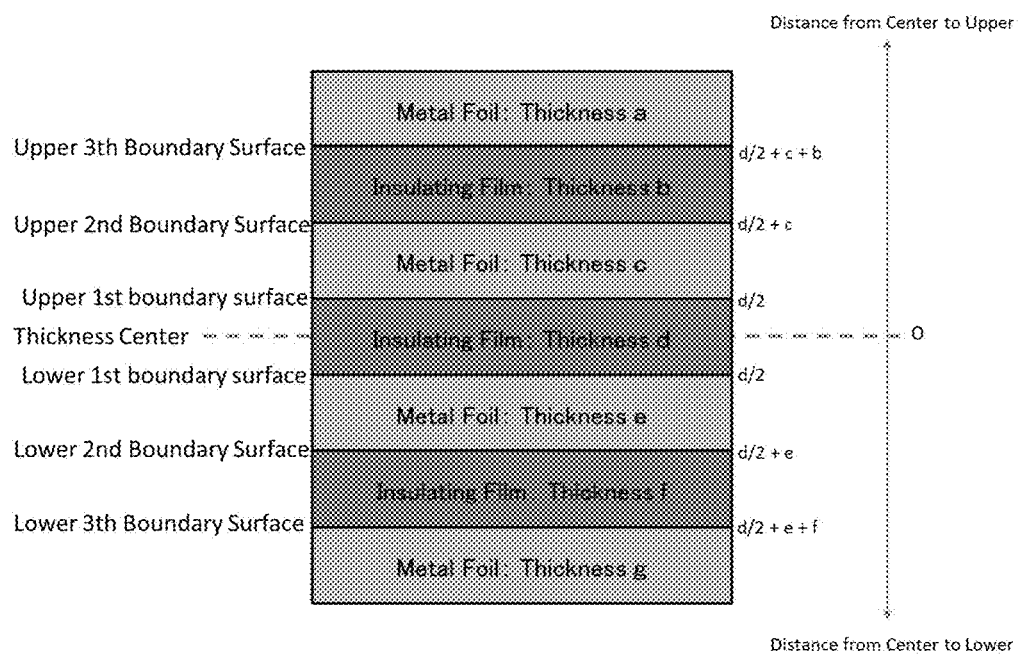

ELECTROMAGNETIC WAVE SHIELDING MATERIAL

TECHNICAL FIELD

The present invention relates to an electromagnetic wave shielding material. More particularly, the present invention relates to a covering material or a cladding material for electric or electronic devices.

BACKGROUND ART

Recently, high attention has been widely focused on global environmental issues, and environmentally-friendly motor vehicles equipped with secondary batteries such as electric vehicles and hybrid vehicles have progressively prevailed. The motor vehicles often employ a mode of converting direct current generated from the mounted secondary battery into alternating current through an inverter, and then supplying required electric power to the alternating current motor to provide driving force. Electromagnetic waves are generated due to switching operation of the inverter and the like. Since the electromagnetic waves disturb reception of on-board acoustic equipment or wireless equipment or the like, countermeasures have been taken to house the inverter or the battery, motor or the like together with the inverter in a metallic case to shield the electromagnetic waves (Japanese Patent Application Laid-open Publication No. 2003-285002 A).

The electromagnetic waves are emitted not only from the motor vehicles but also from many electric and electronic devices including communication devices, displays and medical devices. The electromagnetic waves may cause erroneous operation of precision devices, and an adverse effect on a human body is further concerned. Therefore, various techniques have been developed for reducing the adverse effects of the electromagnetic waves using an electromagnetic wave shielding material. For example, a copper foil composite obtained by laminating a copper foil and a resin film has been used as the electromagnetic wave shielding material (Japanese Patent Application Laid-open Publication No. H07-290449 A). The copper foil has electromagnetic wave shielding properties, and the resin film is laminated for reinforcement of the copper foil. An electromagnetic wave shielding structure is also known, in which metal layers are laminated on an inner side and an outer side of an intermediate layer made of an insulating material, respectively (Japanese Patent No. 4602680). An electromagnetic wave shielding optical member is also known, which comprises a base substrate and a laminated member formed on one surface of the base substrate and composed of a plurality of repetitive unit films comprising a metal layer and a high refractive index layer (niobium pentoxide) (Japanese Patent Application Laid-open Publication No. 2008-21979 A).

CITATION LIST

Patent Literature

Patent Document 1: Japanese Patent Application Laid-Open Publication No. 2003-285002 A Patent Document 2: Japanese Patent Application Laid-Open Publication No. H07-290449 A Patent Document 3: Japanese Patent No. 4602680

Patent Document 4: Japanese Patent Application Laid-Open Publication No. 2008-21979 A

SUMMARY OF INVENTION

Technical Problem

In the motor vehicles, weight reduction has been a major issue in terms of improvement of fuel economy, and substitution of metal materials with resin materials or carbon fiber materials has also been investigated. However, the electromagnetic wave shielding effects cannot be expected for the resin materials and carbon fiber materials, although they can be three-dimensional molded. On the other hand, an excessively decreased thickness of the metallic electromagnetic wave shielding material cannot exhibit excellent the shielding effect and will lead to difficult molding processing due to easy breakage. The techniques described in Japanese Patent Application Laid-Open Publication No. H07-290449 A and Japanese Patent No. 4602680 also require a significantly increased thickness of the electromagnetic wave shielding material for obtaining the excellent shielding effect, so that the sufficient weight reduction cannot be achieved and excellent formability cannot be obtained. The technique described in Japanese Patent Application Laid-Open Publication No. 2008-21979 A is to laminate the nanometric metal layers in order to ensure optical transmission, so that the electromagnetic wave shielding properties are limited, and the excessively thin metal layers lead to poor formability.

The present invention has been made in light of the above circumstances. An object of the present invention is thus to provide an electromagnetic wave shielding material that can exhibit improved electromagnetic wave shielding properties, light-weight property and formability, and more particularly to provide an electromagnetic wave shielding material suitable as a covering material or a cladding material for electric or electronic devices.

Solution to Problem

As a result of extensive studies to solve the above problems, the present inventors have found that the electromagnetic wave shielding effect is remarkably improved by alternately stacking five or more metal foils and resin layers. The present inventors then have found that the laminated structure having symmetry from the thickness center of the laminate to the thickness direction leads to increased adhesion between the metal foil and the resin layer, and higher formability. The present invention has been completed based on these findings and can be set forth as follows.

In an aspect, the present invention relates to an electromagnetic wave shielding material comprising a laminate in which N number of metal foils each having a thickness of 5 to 100 μm and N+1 number of resin layers each having a thickness of 5 μm or more are alternately laminated or a laminate in which N+1 number of metal foils each having a thickness of 5 to 100 μm and N number of resin layers each having a thickness of 5 μm or more are alternately laminated, N being an integer of 2 or more, wherein thickness of the laminate is from 100 to 500 μm, and wherein, when a thickness center of the laminate is used as a reference, for all pairs of interfaces at which sequences of the resin layers and the metal foils on both upper and lower sides of the reference correspond to each other, distances from the reference to the interfaces have an error of within ±10%.

In one embodiment of the electromagnetic wave shielding material according to the present invention, the resin layers comprise a thermoplastic resin.

In another embodiment of the electromagnetic wave shielding material according to the present invention, the resin layers are such that $\delta\sigma/\delta\epsilon$, with $\epsilon=0.2$ to 0.5, in a stress-strain curve (SS curve) is constantly 0 Pa or more.

In yet another embodiment of the electromagnetic wave shielding material according to the present invention, wherein the metal foils are copper foils.

In yet another embodiment of the electromagnetic wave shielding material according to the present invention, plating comprising at least one element selected from the group consisting of Ni, Cr, Co, and Fe is applied to interfaces of the metal foils with the resin layers.

In yet another embodiment of the electromagnetic wave shielding material according to the present invention, a total amount of the plating applied is from 50 to 600 μg/dm².

In yet another embodiment of the electromagnetic wave shielding material according to the present invention, surface roughness of the metal foils is from 0.1 to 1.5 μm in Rz (ten point average roughness).

In another aspect, the present invention relates to a covering material or a cladding material for electric or electronic devices, comprising the electromagnetic shielding material according to the present invention.

In yet another aspect, the present invention relates to an electric or electronic device comprising the covering material or the cladding material according to the present invention.

Advantageous Effects of Invention

The electromagnetic wave shielding material according to the present invention can exhibit an improved electromagnetic wave shielding effect, and further achieve weight reduction, as well as ensure formability because of its laminated structure having high symmetry in the thickness direction. Furthermore, the electromagnetic wave shielding material according to the present invention can be constructed with the simple structure using the metal foils and the resin layers, and can exhibit excellent economic efficiency.

BRIEF DESCRIPTION OF DRAWINGS

FIG. 1 schematically shows an example of a laminated structure for forming an electromagnetic wave shielding material according to the present invention.

DESCRIPTION OF THE PREFERRED EMBODIMENTS

Metal Foil

Materials of the metal foils for use in the electromagnetic wave shielding material according to the present invention are not particularly limited, but metal materials with high conductivity are preferred in terms of improving the shielding properties against an alternating magnetic field and an alternating electric field. Specifically, the metal foils may be preferably formed from a metal having an electric resistivity of $5.0\times10^{-5}$ Ω·m (a value at 20° C.; the same will apply hereinafter) or less. The electric resistivity of the metal may be preferably $1.0\times10^{-7}$ Ω·m or less, and still more preferably $7.0\times10^{-8}$ Ω·m or less, and most preferably $5.0\times10^{-8}$ Ω·m or less. Examples of such metals include iron having an electric resistivity of about $1.0\times10^{-7}$ Ω·m, aluminum having an electric resistivity of about $2.65\times10^{-8}$ Ω·m, copper having an electric resistivity of about $1.68\times10^{-8}$ Ω·m, and silver having an electric resistivity of about $1.59\times10^{-8}$ Ω·m. In view of both the electric resistivity and costs, aluminum or copper may be practically suitable, and copper may be more suitable as the electromagnetic wave shielding material that requires grounding because aluminum will tend to undergo corrosion when contacted with another metal. All of the metal foils used in the electromagnetic wave shielding material according to the present invention may be made of the same metal, or different metals may be used for each layer. Further, alloys of the metals as stated above may be used. Various surface treated layers such as plated layers may be formed on the surfaces of the metal foils for the purpose of adhesion promotion, environmental resistance, heat resistance or rust prevention.

For example, oxidization of the metal foil surface leads to decreased adhesion to the resin layer. Therefore, it is preferable to form a plated layer containing at least one element selected from the group consisting of Ni, Cr, Co, and Fe on the metal foil surface that is in contact with the resin layer, in terms of prevention of oxidization of the metal foil surface and improvement of adhesion to the resin layer. The improvement of adhesion to the resin layer will prevent peeling of the resin layer from the metal foil during molding processing. It also has an effect of improving the shielding performance.

Diffusion of the elements forming the metal foils such as Cu into the plated surface will lead to the decreased adhesion. Therefore, the total amount of the plated layer applied per unit area may preferably be 50 μg/dm² or more, and more preferably 100 μg/dm² or more, and still more preferably 150 μg/dm² or more. Further, a larger thickness of the plated layer will lead to stiffness, resulting in deterioration of formability. Therefore, the total amount of the plated layer applied may preferably be 600 μg/dm² or less, and more preferably 500 μg/dm² or less, and more preferably 400 μg/dm² or less.

Regardless of the presence or absence of the plated layer, the surface of each metal foil may preferably have a roughness of 0.1 μm or more, and more preferably 0.3 μm or more, and still more preferably 0.6 μm or more in Rz (ten point average roughness), in terms of improvement of the adhesion to the resin layer due to the anchor effect. If the roughness of the metal foil surface is too high, strength of the resin near the adhesive interface between the resin layer and the metal foil will tend to deteriorate. The deterioration of the strength of the resin will lead to cohesive failure in the resin layer during the molding process, so that the adhesion is decreased. Therefore, the roughness of the metal foil surface may preferably be 1.5 μm or less, and more preferably 1.3 μm or less, and still more preferably 1.2 μm or less in Rz. In the present invention, Rz (ten point average roughness) is measured by a contact type roughness meter according to JIS B 0601: 1994.

Furthermore, the metal foils may be subjected to Au plating, Ag plating, Sn plating, Ni plating, Zn plating, Sn alloy plating (Sn—Ag, Sn—Ni, Sn—Cu, and the like), a chromate treatment or like, in order to improve environmental resistance and heat resistance that will be required when the metal surface is the outermost layer. These treatments may be combined. The Sn plating or the Sn alloy plating may be preferred in terms of costs.

When using the copper foils as the metal foils, copper having higher purity may be preferred because it will improve the shielding performance. The purity may be preferably 99.5% by mass or more, and more preferably 99.8% by mass or more. Examples of the copper foil that can be used include rolled copper foils, electrolytic copper foils, metallized copper foils and the like. Among them, the rolled copper foils may be preferred because they have good flexibility and formability. When alloy elements are added to the copper foil to form a copper alloy foil, the total content of these elements and inevitable impurities may be less than 0.5% by mass. In particular, the copper foil may preferably contain one or more selected from the group consisting of Sn, Mn, Cr, Zn, Zr, Mg, Ni, Si, and Ag in the total amount of 200 to 2000 ppm by mass, in order to improve elongation as compared with a pure copper foil having the same thickness.

If the thickness of the metal foils used for the electromagnetic wave shielding material according to the present invention is too thin, the ductility of the metal foil may be lowered, leading to easy breakage during molding of the shielding material. If the breakage occurs, the shielding effect will be decreased. Further, if the thickness of each foil is too thin, the lamination of a large number of metal foils will be required for obtaining the improved electromagnetic wave shielding effect, thereby causing a problem of an increase in manufacturing costs. From this viewpoint, the thickness of each metal foil may preferably be 5 µm or more, and more preferably 10 µm or more, and even more preferably 15 µm or more, and still more preferably 20 µm or more, and even more preferably 25 µm or more, and still more preferably 30 µm or more. On the other hand, if the thickness of each foil is too thick, hardness will be developed and the formability will be deteriorated. Therefore, the thickness of each foil may preferably be 100 µm or less, and more preferably 75 µm or less, and more preferably 50 µm or less, and still more preferably 40 µm or less. In the present invention, when the plated layer is formed on the metal foil, the thickness of the metal foil refers to the thickness including the thickness of the plated layer.

(Resin Layer)

In the electromagnetic wave shielding material according to the present invention, significant improvement of the electromagnetic wave shielding effect by laminating a plurality of metal foils can be obtained by interposing the resin layer between the metal foils. Although even if the metal foils are directly laminated to each other, the shielding effect may be improved due to an increase in the total thickness of the metal foils, the significant improvement effect cannot be obtained. The reason would be that the presence of the resin layer between the metal foils increases the number of reflections of electromagnetic waves to attenuate the electromagnetic waves.

In order to improve formability, the resin layers and the metal foils may preferably be directly bonded without using an adhesive. From this viewpoint, a thermoplastic resin may be preferably used for the resin layers. By using the thermoplastic resin as the material of the resin layers, the resin layers and the metal foils can be thermocompression-bonded. The thermoplastic resin includes polyesters such as PET (polyethylene terephthalate), PEN (polyethylene naphthalate) and PBT (polybutylene terephthalate), olefin resins such as polyethylene and polypropylene, polyamides, polyimides, liquid crystal polymers, polyacetals, fluororesins, polyurethanes, acryl resins, epoxy resins, silicone resins, phenol resins, melamine resins, ABS resin, polyvinyl alcohols, urea resins, polyvinyl chloride (PVC), polycarbonates, polystyrenes, styrene butadiene rubbers and the like. Among them, PET, PEN, polyamides, and polyimides may be preferred in terms of processability and costs. The thermoplastic resins may also be thermoplastic elastomers such as urethane rubbers, chloroprene rubbers, silicone rubbers, fluororubbers, styrene-based elastomers, olefinic elastomers, vinyl chloride-based elastomers, urethane-based elastomers, amide-based elastomers and the like. The resin layers used in the electromagnetic wave shielding material according to the present invention may be all the same resin or different resins for each layer. Further, alloys of the resins as stated above may be used. The resin layers may contain fiber reinforcing materials such as carbon fibers, glass fibers and aramid fibers.

A resin that is uniformly deformed over the entire resin layer against tensile stress may be suitable in terms of formability, because local deformation causes a high possibility that the metal foil will be broken even if the resin layer is not broken. Specifically, $\partial\sigma/\partial\varepsilon$ in a stress-strain curve (SS curve) of the resin layer may preferably be constantly 0 Pa or more, with $\varepsilon=0.2$ to 0.5. If there is a position where the $\partial\sigma/\partial\varepsilon$ of the resin layer itself is negative with $\varepsilon=0.2$ to 0.5, which range tends to generate breakage of the metal foil itself in the stress-strain curve (SS curve), then the resulting laminate includes a locally deforming position and the metal foil is liable to be broken during the molding processing.

The method of producing the resin in which the $\partial\sigma/\partial\varepsilon$ is constantly 0 Pa or more with $\varepsilon=0.2$ to 0.5 in the stress-strain curve (SS curve) includes a method of forming a structure in which chain polymers are linked to each other through hydrogen bonds, a method of stretching a film and the like.

The resin materials can be laminated in the form of film or fiber. Although the resin layer may be formed by applying an uncured resin composition to the metal foil and then curing the composition, it is preferable to use a resin film that can be attached to the metal foil, in terms of easy manufacturing.

As stated above, the metal foils and the resin layers are laminated without using an adhesive, but it is also possible to laminate the metal foils and the resin layers with an adhesive as needed. When the adhesive is used, examples of the adhesive includes, but not limited to, acryl resin-based adhesives, epoxy resin-based adhesives, urethane-based adhesives, polyester-based adhesives, silicone resin-based adhesives, vinyl acetate-based adhesives, styrene butadiene rubber-based adhesives, nitrile rubber-based adhesives, phenol resin-based adhesives, cyanoacrylate-based adhesives and the like. Among them, the urethane-based adhesives, the polyester-based adhesives and the vinyl acetate-based adhesives may be preferred in terms of easy manufacturing and costs. When the adhesive is used, the thickness of the adhesive layer may preferably be 6 µm or less. If the thickness of the adhesive layer exceeds 6 µm, only the metal foils tend to be broken after laminating the metal foils and the resin layers.

If the thickness of the resin layers is too thin, the resin layers may be broken together with the metal foils so that the shielding property may be impaired. Therefore, the thickness of each resin layer may preferably be 5 µm or more, and more preferably 10 µm or more, and more preferably 15 µm or more, and still more preferably 20 µm or more. On the other hand, the thickness of each resin layer is too thick, flexibility will be impaired so that it will be difficult to fit the shielding material to a housing. Therefore, the thickness of each resin layer may preferably be 200 µm or less, and more preferably 150 µm or less, and even more preferably 125 µm or less.

(Electromagnetic Wave Shielding Material)

The electromagnetic wave shielding material according to the present invention can be produced by laminating the metal foils and the resin layers as stated above. In one embodiment, the electromagnetic wave shielding material according to the present invention is formed from a laminate in which N number of the metal foils and N+1 number of the resin layers are alternately laminated, wherein N is an integer of 2 or more. In the present embodiment, the resin layers form an uppermost layer and a lowermost layer of the laminate. The forming of the outermost layers of the laminate by the resin layers provides an advantage that formability is improved. Further, it also provides an advantage that corrosion or oxidation of the metal foils can be prevented because the metal foils are protected. However, in the present embodiment, manufacturing costs are increased because processing for grounding will be required.

In another embodiment of the electromagnetic wave shielding material according to the present invention, the electromagnetic wave shielding material is formed from a laminate in which N+1 number of the metal foils and N number of the resin layers are alternately laminated, wherein the number N is an integer of 2 or more. In the present embodiment, the metal foils form an uppermost layer and a lowermost layer of the laminate. When the metal foils form the outermost layers of the laminate, the formability is inferior to the case where the resin layers form the outermost layers, but the processing for grounding will be facilitated.

A larger N increases the number of reflections of electromagnetic waves between the metal foils and the resin layers so that the shielding effect tends to increase. Therefore, N may preferably be 3 or more, and more preferably 4 or more. However, when N is larger, it is necessary to decrease the thickness of each resin layer and each metal foil, and if N is excessively large, the breakage will tend to occur during the molding and the manufacturing costs will be increased. Therefore, N may preferably be 6 or less, and more preferably 5 or less.

In either of the above embodiments, the total number of the metal foils and the resin layers forming the laminate is an odd number. This allows construction of a laminated structure in which the metal foils and the resin layers are arranged symmetrically with respect to a central metal foil or resin layer in the up and down direction (which refers to the thickness direction from the thickness center toward the upper surface and the lower surface of the laminate). Such a laminated structure with high symmetry can provide an effect of suppressing the breakage of the metal foils during the molding processing. According to results of the study by the present inventors, when the thickness center of the laminate is used as a reference, for all pairs of interfaces at which sequences of the resin layers and the metal foils on both upper and lower sides of the reference correspond to each other, distances from the reference to the interfaces preferably have an error of no more than ±10%.

The expression "when the thickness center of the laminate is used as a reference, for all pairs of interfaces at which sequences of the resin layers and the metal foils on both upper and lower sides of the reference correspond to each other, distances from the reference to the interfaces preferably have an error of no more than ±10%" as used herein means that when the distances from the thickness center of the laminate to the interfaces between the resin layers and the metal foils on the upper side are calculated in sequence and the distances from the thickness center of the laminate to the interfaces between the resin layers and the metal foils on the lower side are calculated in sequence, each difference between the distances from the thickness center to the two interfaces of the same sequence is within 10% relative to the shorter distance from the thickness center. All of the corresponding interfaces may preferably be in the distance within an error of ±8%, and more preferably in the distance within an error of ±6%, and even more preferably in the distance within an error of ±4%, and still more preferably in the distance within an error of ±2%, and most preferably in the distance at an error of 0%.

FIG. 1 schematically shows an example of the laminated structure forming the electromagnetic wave shielding material according to the present invention. The laminate of FIG. 1 uses four metal foils (their thicknesses are referred to as a, c, e, and g, respectively) and three insulating films (their thicknesses are referred to as b, d, and f, respectively), and includes the laminated structure in which the metal foils and the insulating films are alternately stacked in the up and down direction from the insulating film disposed at the thickness center of the laminate. There are first interfaces, second interfaces and third interfaces, respectively upward and downward from the thickness center. The distance (d/2) from the thickness center to the upper first interface is inevitably equal to the distance (d/2) from the thickness center to the lower first interface. For the distance (d/2+c) from the thickness center to the upper second interface and the distance (d/2+e) from the thickness center to the lower second interface, a difference between the two distances "=|(d/2+c)−(d/2+e)|=|c−e ↑" is within 10% relative to a smaller value of (d/2+c) and (d/2+e). For example, in the case of (d/2+c)<(d/2+e), 0≤|c−e|/(d/2+c)≤0.1 is applied. In the case of (d/2+c)=(d/2+e), either of them may be used as denominator. For the distance from the thickness center to the upper third interface (d/2+c+b) and the distance from the thickness center to the lower third interface (d/2+e+f), a difference between the two distances "=|(d/2+c+b)−(d/2+e+f)|=|(c+b)−(e+f)|" is within 10% relative to a smaller value of (d/2+c+b) and (d/2+e+f). For example, in the case of (d/2+c+b)<(d/2+e+f), 0≤|(c+b)−(e+f)|/(d/2+c+b)≤0.1 is applied. In the case of (d/2+c+b)=(d/2+e+f), either of them may be used as denominator.

In one embodiment of the electromagnetic wave shielding material according to the present invention, the total thickness of the metal foils may be from 30 to 150 μm, or 100 μm or less, or 80 μm or less.

In one embodiment of the electromagnetic wave shielding material according to the present invention, the total thickness of the resin layers may be from 50 to 400 μm, or 300 μm or less, or 200 μm or less.

In one embodiment of the electromagnetic wave shielding material according to the present invention, the entire thickness of the laminate forming the electromagnetic wave shielding material may be 100 μm or more. The entire thickness of the laminate of 100 μm or more can provide an advantage that the laminate is hardly broken even when it is molded. The entire thickness of the laminate may preferably be 200 μm or more. In one embodiment of the electromagnetic wave shielding material according to the present invention, the entire thickness of the laminate forming the electromagnetic wave shielding material may be 500 μm or less. The entire thickness of the laminate of 500 μm or less can provide an advantage that the molding process will be facilitated. The entire thickness of the laminate may preferably be 400 μm or less, and more preferably 300 μm or less.

The electromagnetic wave shielding material according to the present invention can be used for various electromagnetic wave shielding applications such as covering materials or cladding materials, in particular for electric or electronic devices (for example, inverters, communication devices, resonators, electron tubes, discharge lamps, electric heating devices, electric motors, generators, electronic components, printed circuits, medical devices and the like), covering materials for harnesses and communication cables connected to the electric or electronic devices, electromagnetic wave shielding sheets, electromagnetic wave shielding panels, electromagnetic wave shielding bags, electromagnetic wave shielding boxes, electromagnetic wave shielding chambers, and the like. In particular, the electromagnetic wave shielding material according to the present invention can be suitably utilized in parts for which three-dimensional molded articles of electromagnetic wave shielding materials are required in these applications.

According to one embodiment of the electromagnetic wave shielding material according to the present invention, the electromagnetic wave shielding material may have a magnetic field shielding property (a degree of an attenuated signal on a receiving side) of 23 dB or more at 200 kHz, and preferably a magnetic field shielding property of 25 dB or more. In the present invention, the magnetic field shielding property is measured by a KEC method. The KEC method refers to "an electromagnetic wave shielding property measurement method" in KEC Electronic Industry Development Center.

EXAMPLES

Examples of the present invention are described below together with comparative examples, which are provided for a better understanding of the present invention and its advantages, and are not intended to limit the invention.
(1. Preparation of Metal Foil)

Each metal foil as shown in Table 1 was prepared. For the metal foils, metal ingots as shown in Table 1 were prepared according to the test number, subjected to hot rolling and cold rolling, and then subjected to repeated annealing and cold rolling to obtain metal foils having each thickness as shown in Table 1. In the case of applying plating to the metal foils, after degreasing and pickling, both surfaces of the metal foils were subjected to electroplating according to the test number under conditions and applied amounts as shown in Table 1. Finally, the metal foils were softened by recrystallization annealing. In the case of not applying plating to the metal foils, recrystallization annealing was carried out without degreasing and pickling before the recrystallization annealing, and finally pickling was carried out. In the table, the symbol "-" represents an example which did not apply the plating. Each metal foil was made to have a sufficient size to be able to carry out measurement of its surface roughness, measurement of an amount of plating applied, and preparation of a laminate.

Each symbol described in Table 1 has the following meanings. The conductivity of each metal foil was measured by the double bridge method of JIS C 2525: 1999.
Cu: rolled copper foil (conductivity at 20° C.: $58.0 \times 10^6$ S/m);
Al: aluminum foil (conductivity at 20° C.: $39.6 \times 10^6$ S/m);
Ni: nickel foil (conductivity at 20° C.: $14.5 \times 10^6$ S/m);
Fe: soft iron foil (conductivity at 20° C.: $9.9 \times 10^6$ S/m).
<Measurement of Surface Roughness>

The surface roughness Rz (ten point average roughness) of each metal foil prepared above (in the case of applying the plating, each plated metal foil) was measured by a contact type roughness meter (a surface roughness measuring device SE-3400 available from Kosaka Laboratory Ltd.) according to the standard JIS B 0601: 1994. Table 1 shows an average value when Rz of the surface of each copper foil was measured several times. A variation of the Rz value was generally within ±0.2 μm. Table 1 lists one Rz value per one test example, which means that the Rz values on the surfaces of all the metal foils used in one test example were adjusted to ±0.2 μm of the values shown in Table 1. The Rz can be adjusted by changing current density during the plating or roughness of the metal foil before plating.
<Measurement of Amount of Plating Applied>

The amount of plating applied per unit area was calculated by measuring the weights before and after plating. In the case of alloy plating, the applied amount is represented by the total value of the applied amounts of the respective plating elements. It should be noted that Table 1 lists the value of one applied amount per one test example, which means that amounts of plating applied onto the surface of all the metal foils used in one test example were adjusted to ±5 μg/dm² of the values as shown in Table 1.
(2. Preparation of Insulating Film)

Commercially available insulating films were used. Each symbol described in Table 1 represents the following meanings:
PP: thermoplastic polypropylene film
PBT: thermoplastic polybutylene terephthalate film
TPU: thermoplastic polyurethane film
PC: thermoplastic polycarbonate film
TPI: thermoplastic polyimide.
<Measurement of $\partial\sigma/\partial\varepsilon$>

For each of the prepared insulating films, a test piece having a width of 12.7 and a length of 150 mm was prepared in accordance with JIS K 7127: 1999, and a stress-strain curve (SS curve) was obtained by conducting a tensile test at a pulling rate of 50 mm/min using a tensile tester (Model: Autograph AGS-10 kN available from Shimadzu Corporation). Results were designated as "○ (single circle)" and "x"; "○ (single circle)" means a case where $\partial\sigma/\partial\varepsilon$ with $\varepsilon=0.2$ to $0.5$ was constantly 0 Pa or more, for all the insulating films used in the laminates for each test example, and "x" means a case where there was a position where $\partial\sigma/\partial\varepsilon$ with $\varepsilon=0.2$ to $0.5$ was less than 0 Pa, in at least one insulating film used for the laminate. The results are shown in Table 1. Comparative Examples 3 and 4 were evaluated as "x"; in these comparative examples, although the type of the insulating film used was identical, the chain polymers were not linked to each other by hydrogen bonds or the film was not stretched.
(3. Preparation of Electromagnetic Wave Shielding Material)

Electromagnetic wave shielding materials of Examples and Comparative Examples having the respective laminated structures as shown in Table 1 were produced by alternately laminating the prepared metal foils and insulating films and thermocompression-bonding them under a pressure of 10 N/cm² and at a temperature of 160° C. for PP, 200° C. for PBT, 180° C. for TPU, 230° C. for PC, or 280° C. for TPI.
<Symmetry>

Distances in the thickness direction from the thickness center of the laminate forming the electromagnetic wave shielding material to the respective interfaces between the insulating films (resin layers) and the metal foils were calculated, respectively. The distance from the thickness center to each interface in the direction toward one surface was compared with the distance from the thickness center to each interface in the direction toward the opposite surface. Results were designated as "○ (single circle)" and "x"; "○ (single circle)" means a case where all the differences between the two distances to the corresponding interfaces were within 10% relative to the shorter distance from the thickness center, and "x" means other cases. The results are shown in Table 2.

<Evaluation of Adhesion>

One metal foil and one resin layer used in each test example were separately prepared, and both were thermo-compression-bonded under a pressure of 10 N/cm$^2$ and at a temperature of 160° C. for PP, 200° C. for PBT, 180° C. for TPU, 230° C. for PC, and 280° C. for TPI to prepare each sample for a peel test. The peel test at 90° was performed on the resulting samples according to JIS C 5016: 1994. Results were designated as "⊚ (double circle)", "○ (single circle)" and "x", in which "⊚ (double circle)" represents a case where the peel strength was 0.7 kN/m or more, "○ (single circle)" represents a case where the peel strength was 0.3 kN/m or more and less than 0.7 kN/m, and "x" represents a case where the peel strength was less than 0.3 kN/m. The results are shown in Table 2.

<Evaluation of Formability>

The electromagnetic wave shielding material of each test example was molded in a mold for making a hemisphere having a radius of 50 mm at a material temperature and a mold temperature of 50° C. by a 5-ton press, and results were designated as "○ (single circle)" and "x"; "x" represents an electromagnetic wave shielding material in which the metal foil or the laminate (metal foils+resin layers) was broken, and "○ (single circle)" represents an electromagnetic wave shielding material in which they were not broken. Incidentally, breakage of only the resin layers was not observed. The results are shown in Table 2.

<Shielding Property>

The electromagnetic wave shielding material of each test example was installed in a magnetic field shielding effect evaluation device (model TSES-KEC available from Techno Science Japan Co., Ltd.), and the magnetic field shielding effect was evaluated by the KEC method at a frequency of 200 kHz and at 20° C. A material exerted a shielding effect of 25 dB or more was designated as "⊚ (double circle)", a material exerted a shielding effect of 23 dB or more and less than 25 dB was designated as "○ (single circle)", and a material exerted a shielding effect of less than 23 dB was designated as "x". The results are shown in Table 2.

(Discussion)

The results are shown in Table 2. In Comparative Example 1, the number of the metal foils and the resin layers was insufficient, so that a high electromagnetic wave shielding effect could not be obtained. In each of Comparative Examples 2 to 7, the symmetry of the laminate was poor, so that there was the problem of formability. Further, in Comparative Example 2, the adhesion was good because it carried out the rolling with rolls each having a rough surface such that the roughness Rz of the copper surface was 0.8 μm. In Comparative Example 3, although the plating was applied, cohesive failure of the resin occurred due to the increased roughness Rz of the metal foils, resulting in poor adhesion and formability. In each of Comparative Examples 1 and 4, Cu—Ni—Co alloy plating was applied so that the surface roughness Rz was 0.8 μm, thereby resulting in good adhesion. In each of Comparative Examples 5 and 6, no plating was applied, so that the adhesion was poor. In Comparative Example 7, the adhesion was good because compatibility of TPU with the Cu—Ni—Co alloy plating was good and the surface roughness of the metal foils was appropriate, but the formability became insufficient due to the symmetry problem. On the other hand, in each of Examples 1 to 18, the laminated structure of the metal foils and the resin layers was appropriate and exhibited an improved balance in the electromagnetic wave shielding property, light-weight property and formability.

TABLE 1

| | | Metal Foil | | | | | | Resin Layer | | | |
|---|---|---|---|---|---|---|---|---|---|---|---|
| | Laminated Structure | Type | Number | Thickness (μm) Described in Lamination Order | Plating Composition | Applied Amount (μg/dm$^2$) | Rz (μm) | Type | Number | Thickness (μm) Described in Lamination Order | ∂σ/∂ε |
| Example | | | | | | | | | | | |
| 1 | PP/Cu/PP/Cu/PP | Cu | 2 | 35, 35 | Ni—Co Alloy | 105 | 0.5 | PP | 3 | 25, 150, 25 | ○ |
| 2 | Cu/PBT/Cu/PBT/Cu | Cu | 3 | 18, 18, 18 | Ni | 60 | 0.4 | PBT | 2 | 100, 100 | ○ |
| 3 | TPU/Cu/TPU/Cu/TPU | Cu | 2 | 35, 35 | Cu—Ni Alloy | 230 | 0.7 | TPU | 3 | 50, 100, 50 | ○ |
| 4 | PC/Cu/PC/Cu/PC/Cu/PC/Cu/PC | Cu | 4 | 18, 9, 9, 18 | Cu—Ni—Co Alloy | 480 | 1.2 | PC | 5 | 25, 25, 50, 25, 25 | ○ |
| 5 | PP/Cu/PP/Cu/PP | Cu | 2 | 18, 18 | — | — | 0.7 | PP | 3 | 50, 150, 50 | ○ |
| 6 | Cu/PBT/Cu/PBT/Cu | Cu | 3 | 18, 12, 18 | Fe | 50 | 0.4 | PBT | 2 | 100, 100 | ○ |
| 7 | TPU/Cu/TPU/Cu/TPU | Cu | 2 | 18, 18 | Cu—Ni—Co Alloy | 230 | 0.7 | TPU | 3 | 50, 100, 50 | ○ |
| 8 | Cu/PC/Cu/PC/Cu | Cu | 3 | 18, 35, 18 | Cu—Ni—Co Alloy | 230 | 0.7 | PC | 2 | 100, 100 | ○ |
| 9 | PP/Cu/PP/Cu/PP | Cu | 2 | 35, 35 | Cu—Ni—Co Alloy | 250 | 0.7 | PP | 3 | 100, 100, 100 | ○ |
| 10 | PBT/Cu/PBT/Cu/PBT/Cu/PBT | Cu | 3 | 18, 12, 18 | Cu—Ni—Co Alloy | 240 | 0.7 | PBT | 4 | 50, 100, 100, 50 | ○ |
| 11 | TPU/Cu/TPU/Cu/TPU | Cu | 2 | 35, 35 | Cu—Ni—Co Alloy | 260 | 0.7 | TPU | 3 | 50, 150, 50 | ○ |
| 12 | TPI/Cu/TPI/Cu/TPI/Cu/TPI | Cu | 3 | 18, 18, 18 | Cu—Ni—Co Alloy | 260 | 0.7 | TPI | 4 | 75, 75, 75, 75 | ○ |
| 13 | PC/Ni/PC/Ni/PC | Ni | 2 | 30, 30 | — | — | 0.5 | PC | 3 | 100, 100, 100 | ○ |
| 14 | PP/Al/PP/Al/PP | Al | 2 | 25, 25 | — | — | 0.6 | PP | 3 | 75, 100, 75 | ○ |
| 15 | PBT/Fe/PBT/Fe/PBT | Fe | 2 | 50, 50 | — | — | 0.7 | PBT | 3 | 100, 150, 100 | ○ |
| 16 | TPU/Al/TPU/Al/TPU | Al | 2 | 25, 25 | — | — | 0.8 | TPU | 3 | 50, 75, 50 | ○ |

TABLE 1-continued

| | | Metal Foil | | | | | | Resin Layer | | | |
|---|---|---|---|---|---|---|---|---|---|---|---|
| | Laminated Structure | Type | Number | Thickness (μm) Described in Lamination Order | Plating Composition | Applied Amount (μg/dm²) | Rz (μm) | Type | Number | Thickness (μm) Described in Lamination Order | ∂σ/∂ε |
| 17 | PC/Cu/PC/Cu/PC/Cu/PC/Cu/PC | Cu | 4 | 18, 12, 9, 18 | Cu—Ni—Co Alloy | 480 | 1.2 | PC | 5 | 25, 25, 100, 25, 25 | ○ |
| 18 | TPU/Cu/TPU/Cu/TPU/Cu/TPU/Cu/TPU | Cu | 4 | 18, 9, 9, 22 | Cu—Ni—Co Alloy | 480 | 1.2 | TPU | 5 | 50, 50, 100, 50, 50 | ○ |
| Comp. Example | | | | | | | | | | | |
| 1 | PP/Cu/PP | Cu | 1 | 50 | Cu—Ni—Co Alloy | 250 | 0.8 | PP | 2 | 50, 50 | ○ |
| 2 | Cu/TPU/Cu | Cu | 2 | 18, 35 | — | — | 0.8 | TPU | 1 | 50 | ○ |
| 3 | Cu/PC/Cu/PC/Cu/PC/Cu | Cu | 4 | 12, 12, 12, 12 | Cu—Ni Alloy | 1050 | 1.8 | PC | 3 | 50, 75, 75 | X |
| 4 | PP/Cu/PP/Cu/PP | Cu | 2 | 12, 35 | Cu—Ni—Co Alloy | 250 | 0.8 | PP | 3 | 50, 50, 100 | X |
| 5 | PP/Ni/PP/Ni/PP/Ni/PP | Ni | 3 | 30, 30, 30 | — | — | 0.5 | PP | 4 | 100, 50, 100, 50 | ○ |
| 6 | PBT/Al/PBT/Al/PBT/Al/PBT | Al | 3 | 50, 25, 50 | — | — | 0.3 | PBT | 4 | 25, 12, 25, 12 | ○ |
| 7 | TPU/Cu/TPU/Cu/TPU/Cu/TPU/Cu/TPU | Cu | 4 | 18, 9, 9, 20 | Cu—Ni—Co Alloy | 480 | 1.2 | TPU | 5 | 50, 50, 100, 75, 50 | ○ |

TABLE 2

| | Characterization of Shielding Material | | | | |
|---|---|---|---|---|---|
| Example | Symmetry | Adhesion | Formability | Total Thickness (μm) | Shielding Effect |
| 1 | ○ | ◎ | ◎ | 135 | ◎ |
| 2 | ○ | ◎ | ◎ | 254 | ◎ |
| 3 | ○ | ◎ | ◎ | 270 | ◎ |
| 4 | ○ | ◎ | ◎ | 204 | ◎ |
| 5 | ○ | ○ | ○ | 286 | ◎ |
| 6 | ○ | ◎ | ◎ | 248 | ◎ |
| 7 | ○ | ◎ | ◎ | 236 | ◎ |
| 8 | ○ | ◎ | ◎ | 271 | ◎ |
| 9 | ○ | ◎ | ◎ | 370 | ◎ |
| 10 | ○ | ◎ | ◎ | 348 | ◎ |
| 11 | ○ | ◎ | ◎ | 320 | ◎ |
| 12 | ○ | ◎ | ◎ | 354 | ◎ |
| 13 | ○ | ○ | ○ | 360 | ○ |
| 14 | ○ | ○ | ○ | 300 | ○ |
| 15 | ○ | ○ | ○ | 450 | ○ |
| 16 | ○ | ○ | ○ | 225 | ○ |
| 17 | ○ | ◎ | ◎ | 254 | ◎ |
| 18 | ○ | ◎ | ◎ | 381 | ◎ |

| | Characterization of Shielding Material | | | | |
|---|---|---|---|---|---|
| Comp. Example | Symmetry | Adhesion | Formability | Total Thickness (μm) | Shielding Effect |
| 1 | ○ | ◎ | ○ | 150 | X |
| 2 | X | ○ | X | 103 | ◎ |
| 3 | X | X | X | 248 | ◎ |
| 4 | X | ○ | X | 247 | ◎ |
| 5 | X | X | X | 390 | ◎ |
| 6 | X | X | X | 149 | ◎ |
| 7 | X | ◎ | X | 381 | ◎ |

The invention claimed is:

1. An electromagnetic wave shielding material comprising a laminate in which N number of metal foils each having a thickness of 15 μm to 100 μm and N+1 number of resin layers each having a thickness of 5 μm to 150 μm are alternately laminated or a laminate in which N+1 number of metal foils each having a thickness of 15 μm to 100 μm and N number of resin layers each having a thickness of 5 μm to 150 μm are alternately laminated, N being an integer of 2 or more, wherein thickness of the laminate is from 100 μm to 500 μm, and wherein, when a thickness center of the laminate is used as a reference, for all pairs of interfaces at which sequences of the resin layers and the metal foils on both upper and lower sides of the reference correspond to each other, distances from the reference to the interfaces have an error of within ±10%, wherein the resin layer consists of a thermoplastic resin that is insulating, and wherein the resin layers and metal foils are directly bonded without using an adhesive, wherein the resin layers are such that $\partial\sigma/\partial\varepsilon$, with $\varepsilon=0.2$ to $0.5$, in a stress-strain curve (SS curve) is constantly 0 Pa or more, wherein the metal foils are optionally plated.

2. The electromagnetic wave shielding material according to claim 1, wherein the metal foils are copper foils.

3. The electromagnetic wave shielding material according to claim 1, wherein the metal foils are plated and wherein plating comprising at least one element selected from the group consisting of Ni, Cr, Co, and Fe is applied to interfaces of the metal foils with the resin layers.

4. The electromagnetic wave shielding material according to claim 3, wherein a total amount of the plating applied is from 50 μg/dm² to 600 μg/dm².

5. The electromagnetic wave shielding material according to claim 1, wherein surface roughness of the metal foils is from 0.1 μm to 1.5 μm in Rz (ten point average roughness).

6. A covering material or a cladding material for electric or electronic devices, comprising the electromagnetic shielding material according to claim 1.

7. An electric or electronic device comprising the covering material according to claim 6.

8. An electric or electronic device comprising the cladding material according to claim 6.

9. The electromagnetic wave shielding material according to claim 1, wherein the electromagnetic wave shielding material has a magnetic field shielding property of 23 dB or more at 200 kHz.

* * * * *